(12) United States Patent
Schuegraf

(10) Patent No.: US 6,597,022 B1
(45) Date of Patent: *Jul. 22, 2003

(54) METHOD FOR CONTROLLING CRITICAL DIMENSION IN AN HBT EMITTER AND RELATED STRUCTURE

(75) Inventor: Klaus F. Schuegraf, Aliso Viejo, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/067,159

(22) Filed: Feb. 4, 2002

(51) Int. Cl.$^7$ .................................. H01L 31/0328
(52) U.S. Cl. ................ 257/183; 257/197; 257/200
(58) Field of Search ...................... 257/183, 197, 257/198, 200, 201; 438/312, 321

(56) References Cited

U.S. PATENT DOCUMENTS 6,251,738 B1 * 6/2001 Huang ...................... 438/312
6,316,818 B1 * 11/2001 Marty et al. ............... 257/592
6,337,494 B1 * 1/2002 Ryum et al. ............... 257/197
6,384,469 B1 * 5/2002 Chantre ..................... 257/565

* cited by examiner

Primary Examiner—Tuan H. Nguyen
(74) Attorney, Agent, or Firm—Farjami & Farjami LLP

(57) ABSTRACT

According to one exemplary embodiment, a heterojunction bipolar transistor comprises a base. The heterojunction bipolar transistor further-comprises a first nitride spacer and a second nitride spacer situated on the base, where the first nitride spacer and the second nitride spacer are separated by a distance substantially equal to a critical dimension. For example, the first nitride spacer and the second nitride spacer may comprise LPCVD or RTCVD silicon nitride. According to this exemplary embodiment, the heterojunction bipolar transistor further comprises an emitter situated between said first nitride spacer and said second nitride spacer, where the emitter has a width substantially equal to the critical dimension. The emitter may, for example, comprise polycrystalline silicon. In another embodiment, a method that achieves the above-described heterojunction bipolar transistor is disclosed.

16 Claims, 5 Drawing Sheets

METHOD FOR CONTROLLING CRITICAL DIMENSION IN AN HBT EMITTER AND RELATED STRUCTURE

BACKGROUND OF THE INVENTION

1. Field of the Invention

The present invention relates to the field of fabrication of semiconductor devices. More specifically, the invention relates to the fabrication of semiconductor heterojunction bipolar transistors.

2. Background Art

In a heterojunction bipolar transistor, or HBT, a thin silicon-germanium ("SiGe") layer is grown as the base of a bipolar transistor on a silicon wafer. The SiGe HBT has significant advantages in speed, frequency response, and gain when compared to a conventional silicon bipolar transistor. Speed and frequency response can be compared by the cutoff frequency which, simply stated, is the frequency where the gain of a transistor is considerably reduced. Cutoff frequencies in excess of 100 GHz have been achieved for the HBT, which are comparable to the more expensive GaAs. Previously, silicon-only devices have not been competitive for use where very high speed and frequency response are required.

The higher gain, speed and frequency response of the SiGe HBT are possible due to certain advantages of silicon-germanium, such as a narrower band gap and reduced resistivity. These advantages make silicon-germanium devices more competitive than silicon-only devices in areas of technology where high speed and high frequency response are required.

The advantages of high speed and high frequency response discussed above require, among other things, that certain dimensions, such as the width of the emitter, be very accurately controlled. A dimension, which critically affects the performance of devices on a semiconductor, such as the emitter width in a HBT, is generally referred to as critical dimension, or "CD." Chip manufacturers calculate a CD budget for the semiconductor wafer, i.e. the allowable variation of critical dimensions on the wafer surface. As device feature sizes become smaller, it becomes more difficult to accurately control the dimensions of features such as emitter width.

Control of feature dimensions is difficult because every step in the photolithographic patterning process contributes variations. For example, unwanted variation in dimension of a feature may be caused by defects in the photomask; To reflectivity of a surface of the material below the photoresist, referred to as "subsurface reflectivity," which causes scattering of the light used to expose the photoresist; adhesion problems between an antireflective coating and the wafer and photomask; or poor matching of index of refraction between an antireflective coating and the photomask. Thus, as feature sizes become smaller, the CD budget becomes stricter, necessitating more accurate control over critical dimensions, for example the emitter width of the SiGe HBT. In the case of the SiGe NPN HBT control of the emitter width is essential to the performance of the device.

In one approach to forming a polycrystalline silicon emitter with critical dimension control in a SiGe HBT, an emitter window opening is formed in a layer of silicon oxynitride, which is then selectively etched to the single crystal SiGe base. However, selectively etching silicon oxynitride to the single crystal SiGe base is difficult and can cause pitting and recessing damage to the SiGe base. In addition, unwanted silicon oxynitride is difficult to remove after the emitter has been formed. Unremwved silicon oxynitride can degrade the performance of the SiGe HBT. Thus, use of silicon oxynitride does not provide a satisfactory solution to the problem of forming a polycrystalline silicon emitter with critical dimension control.

Another approach to forming a polycrystalline silicon emitter with critical dimension control in a SiGe HBT utilizes silicon dioxide ("oxide") spacers formed on a base oxide layer on the top surface of the SiGe HBT. A polysilicon post is formed between the two oxide spacers, and the polysilicon post and oxide spacers are coveted by an oxide layer, an amorphous silicon layer, and an oxynitride layer. An emitter window opening is created by patterning and etching the oxynitride, amorphous silicon, silicon dioxide layer, and the polysilicon post. The oxide layer in the emitter Window opening is then etched to expose the top surface of the base. The emitter of the SiGe HBT can then be formed by depositing polycrystalline silicon on the top surface of the base. However, in the process of etching the base oxide layer, the silicon dioxide spacers are also laterally etched. As a result, the above approach undesirably widens the emitter window opening. Thus, the use of silicon dioxide spacers does not provide a satisfactory solution to the problem of forming an HBT emitter with critical dimension control.

Thus, there is a need in the art for an emitter structure in an HBT having a precisely controlled emitter width.

SUMMARY OF THE INVENTION

The present invention is directed method for controlling critical dimension in an HBT emitter and related structure. The present invention addresses and resolves the need in the art for a polycrystalline silicon emitter structure in an HBT that achieves a precisely controlled emitter width.

According to one exemplary embodiment, a heterojunction bipolar transistor comprises a base having a top surface. The heterojunction bipolar transistor, for example, may be an NPN silicon-germanium heterojunction bipolar transistor. The heterojunction bipolar transistor further comprises a first nitride spacer and a second nitride spacer situated on the base, where the first nitride spacer and the second nitride spacer are separated by a distance substantially equal to a critical dimension. For example, the first nitride spacer and the second nitride spacer may comprise LPCVD or RTCVD silicon nitride. The heterojunction bipolar transistor might further comprise an etch stop layer situated on the top surface of the base and below the first and second spacers. The etch stop layer can, for example, comprise silicon oxide.

According to this exemplary embodiment, the heterojunction bipolar transistor further comprises an emitter situated between said first nitride spacer and said second nitride spacer, where the emitter has a width substantially equal to the critical dimension. The emitter may, for example, comprise polycrystalline silicon. The heterojunction bipolar transistor might further comprise an amorphous layer situated on the first and second nitride spacer. For example, the amorphous layer may, for example, comprise amorphous silicon. The heterojunction bipolar transistor might further comprise an antireflective coating layer situated on the amorphous layer. The antireflective coating layer may, for example, comprise silicon oxynitride. In another embodiment, the present invention is a method that achieves the above-described heterojunction bipolar transistor.

Other features and advantages of the present invention will become more readily apparent to those of ordinary skill

DETAILED DESCRIPTION OF THE INVENTION

The present invention is directed to method for controlling critical dimension in an HBT emitter and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
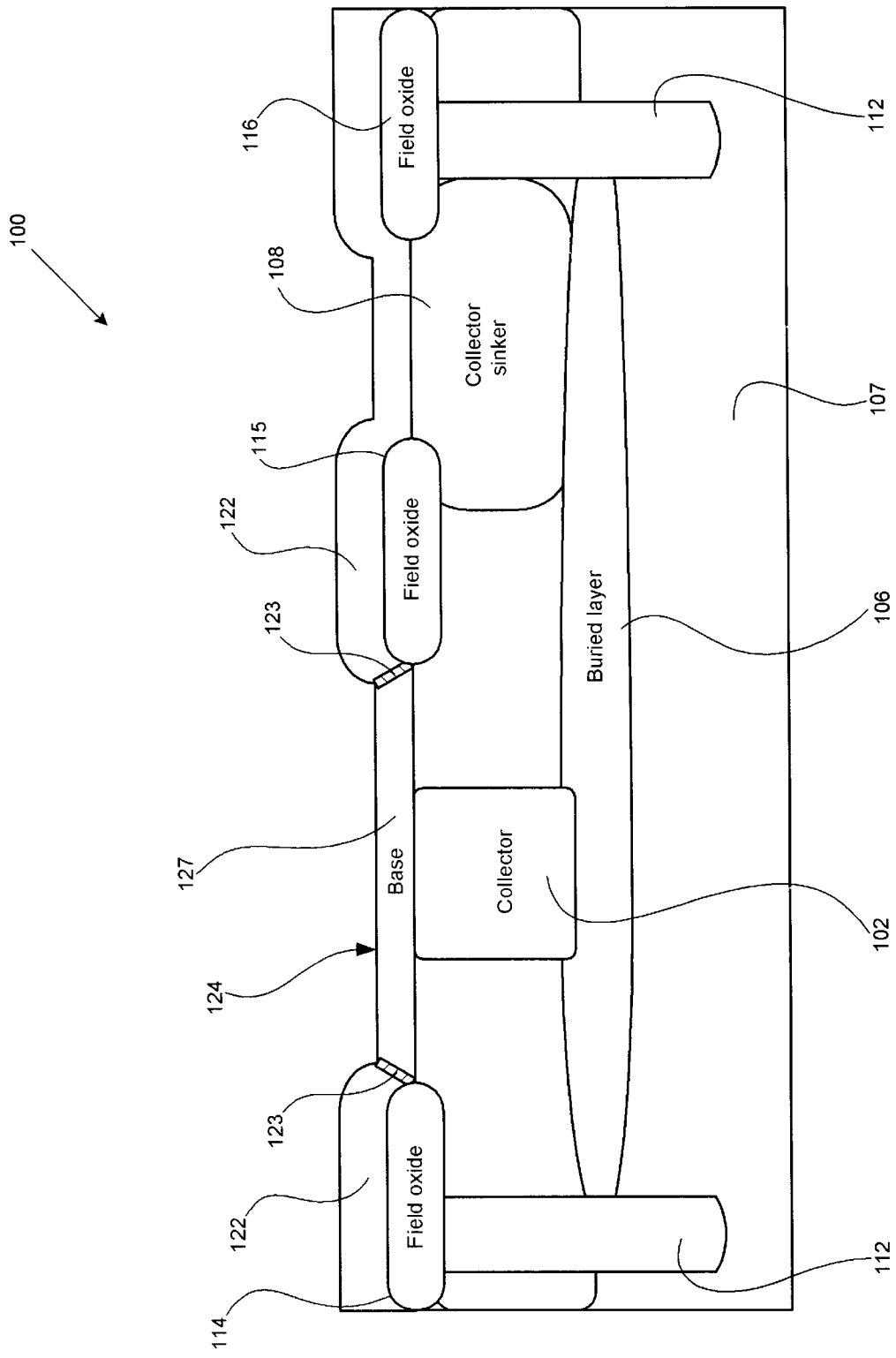
FIG. 1 illustrates a cross-sectional view of some of the features of an exemplary NPN HBT prior to application of the steps taken to implement an embodiment of the present invention.

FIG. 1 shows exemplary structure 100, which is utilized to describe the present invention. Certain details and features have been left out of FIG. 1, which are apparent to a person of ordinary skill in the art. Structure 100 includes collector 102 and base 127 for a SiGe heterojunction bipolar transistor ("HBT"). In the present embodiment, collector 102 is N-type single crystal silicon that can be formed using a do pant diffusion process in a manner known in the art. In the present embodiment, base 127 is P-type. SiGe single crystal that might be deposited epitaxially in a LPCVD process. Base 127 may be implanted with boron ions to achieve the aforementioned P-type doping. As seen in FIG. 1, base 127 is situated on top of, and forms ajunction with, collector 102. In the present embodiment, base contact 122 is polycrystalline SiGe that may be deposited epitaxially in a LPCVD process. Base 127 and base contact 122 connect with each other at interface 123 between the contact polycrystalline material and the base single crystal material. Base 127 has a base top surface 124.

As seen in FIG. 1, buried layer 106, which is composed of n+type material, i.e. it is relatively heavily doped N-type material, is formed in silicon substrate 107 in a manner known in the art. Collector sinker 108, also comprised of n+type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in any of the Figures). Deep trenches 112 and field oxide isolation regions 114, 115, and 116 may be composed of silicon dioxide ($SiO_2$) material and are formed in a manner known in the art. Deep trenches 112 and field oxide isolation regions 114, 115, and 116 provide electrical isolation from other devices on silicon substrate 107 in a manner known in the art. Thus, FIG. 1 shows that structure 100 includes several features and components used to form an HBT at a stage prior to formation of an emitter comprised of N-type polycrystalline silicon above base 127.

Figure 2:
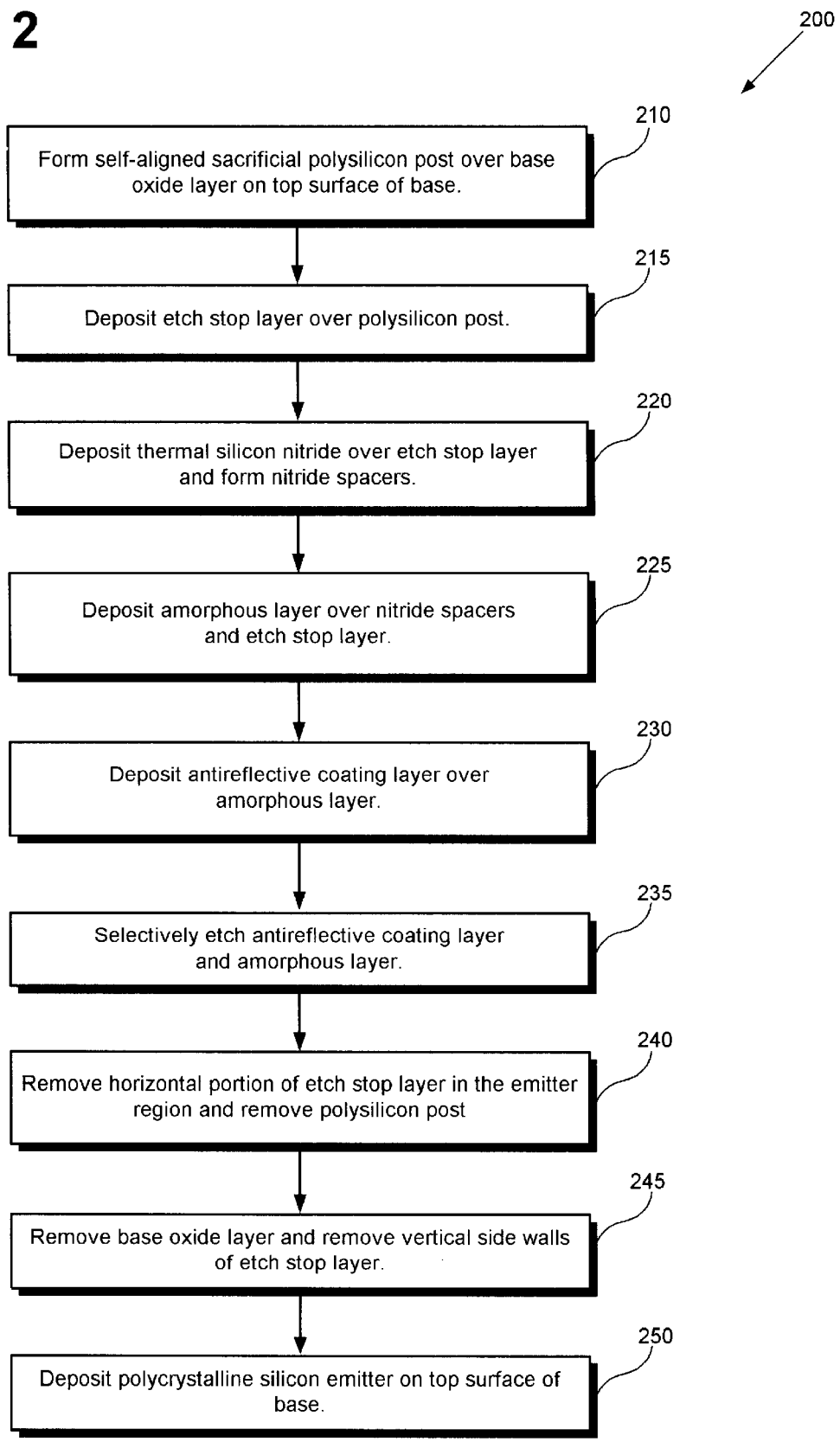
FIG. 2 shows a flowchart illustrating the steps taken to implement an embodiment of the present invention.

FIG. 2 shows flowchart 200, which describes the steps, according to one embodiment of the present invention, in the processing of a wafer that includes structure 100. Certain details and features have been left out of flowchart 200 that are apparent to a person of ordinary skill in the art. For example, a step may consist of one or more substeps or may involve specialized equipment or materials, as known in the art.

Steps 210 through 290 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 210, includes structure 100 shown in FIG. 1. In particular, the wafer includes base top surface 124 of base 127 on which formation of an emitter comprised of N-type polycrystalline silicon is to take place in an "emitter region." Furthermore, the aforementioned emitter region includes a "critical dimension," which is equal to the distance between two nitride spacers. Once the emitter has been deposited it will have an "emitter width" equal to the critical dimension. In one embodiment, the deposited emitter may have an "emitter width" substantially equal to the critical dimension.

Figure 3A:
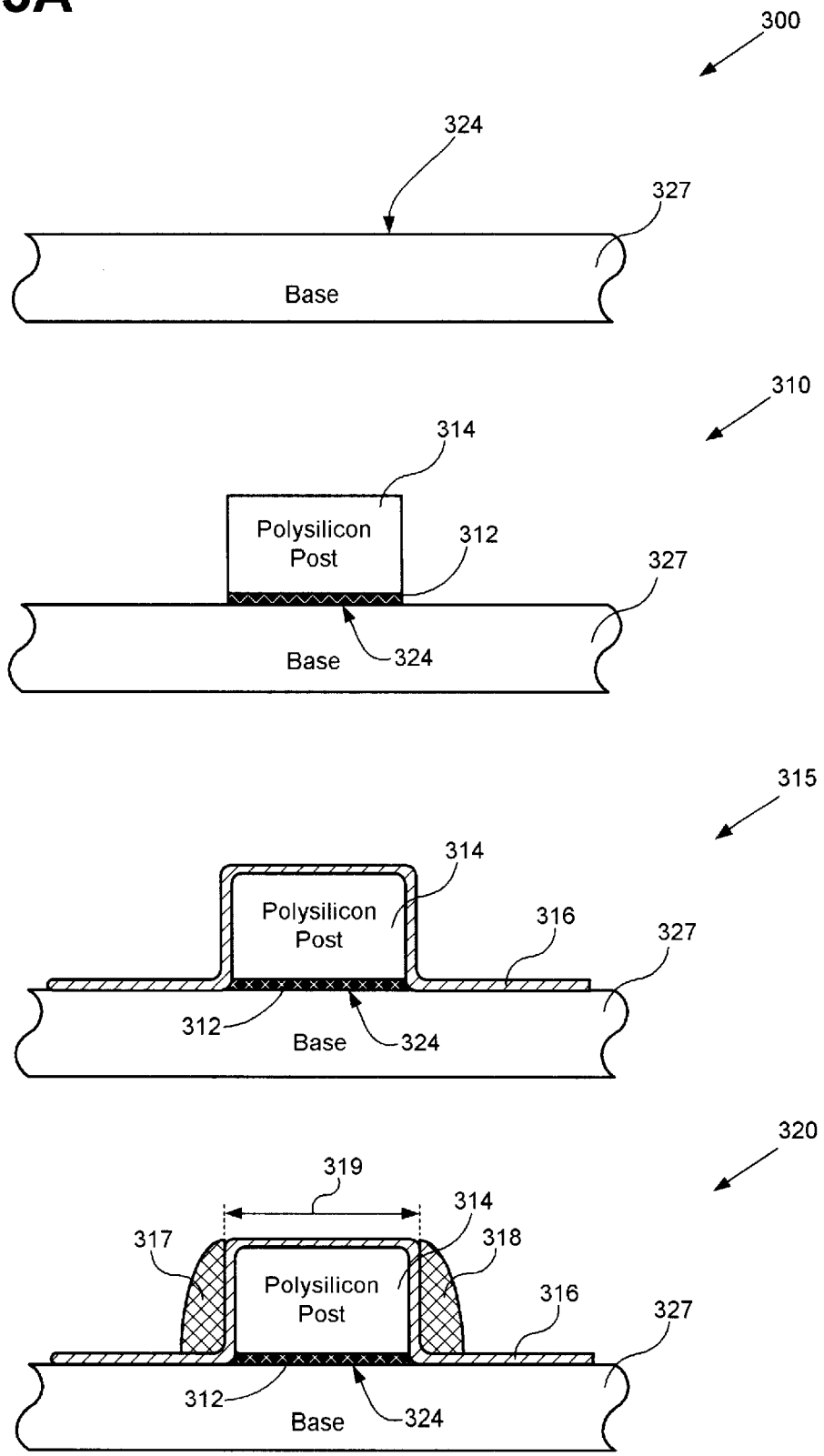
FIG. 3A illustrates cross-sectional views, which include portions of a silicon wafer processed according to an embodiment of the invention, corresponding to certain steps of FIG. 2.

Referring now to FIG. 3A, structure 300 of FIG. 3A shows a portion of structure 100 of FIG. 1. Base 127 and top surface 124 of structure 100 are shown in structure 300 as base 327 and top surface 324, respectively. For simplicity, other features such as base contact 122, interface 123, collector 102, buried layer 106, silicon substrate 107, collector sinker 108, deep trenches 112, and field oxide regions 114, 115, and 116, are not shown in structure 300. Structure 300 thus shows the portion of a wafer including top surface 324 of base 327, on which the formation of an emitter comprised of N-type polycrystalline silicon is to take place, before processing the wafer according to one embodiment of the invention shown in flowchart 200 of FIG. 2. In particular, structure 300 shows a portion of the wafer before processing step 210 of flowchart 200.

Figure 3B:
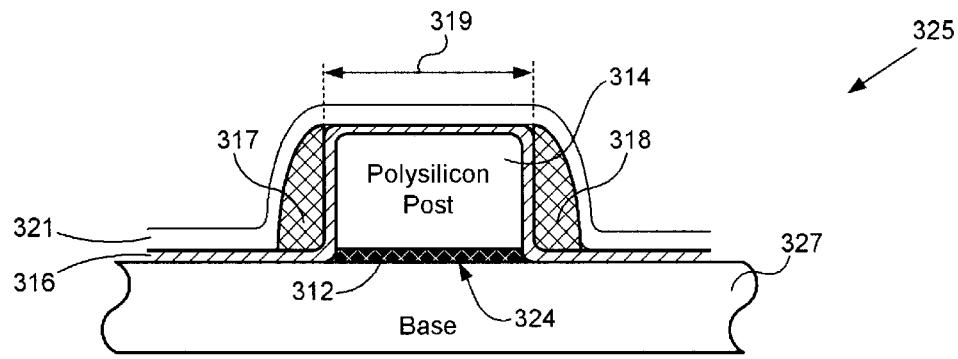
FIG. 3B illustrates cross-sectional views, which include portions of a silicon wafer processed according to an embodiment of the invention, corresponding to certain steps of FIG. 2.
Figure 3B:
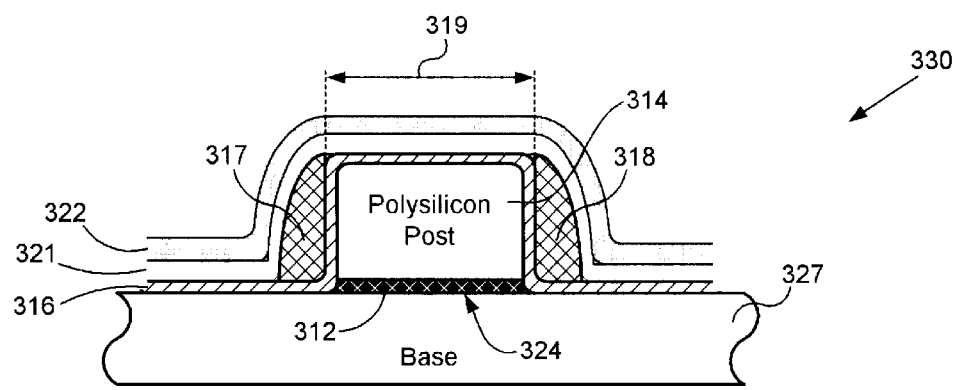
Figure 3B:
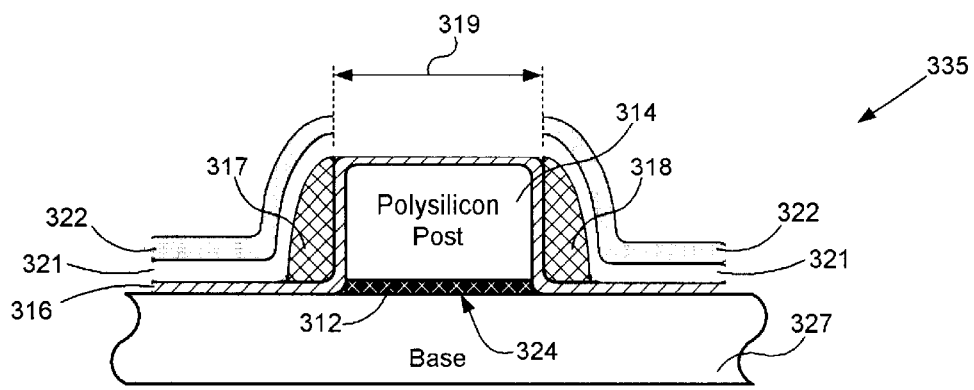
Figure 3C:
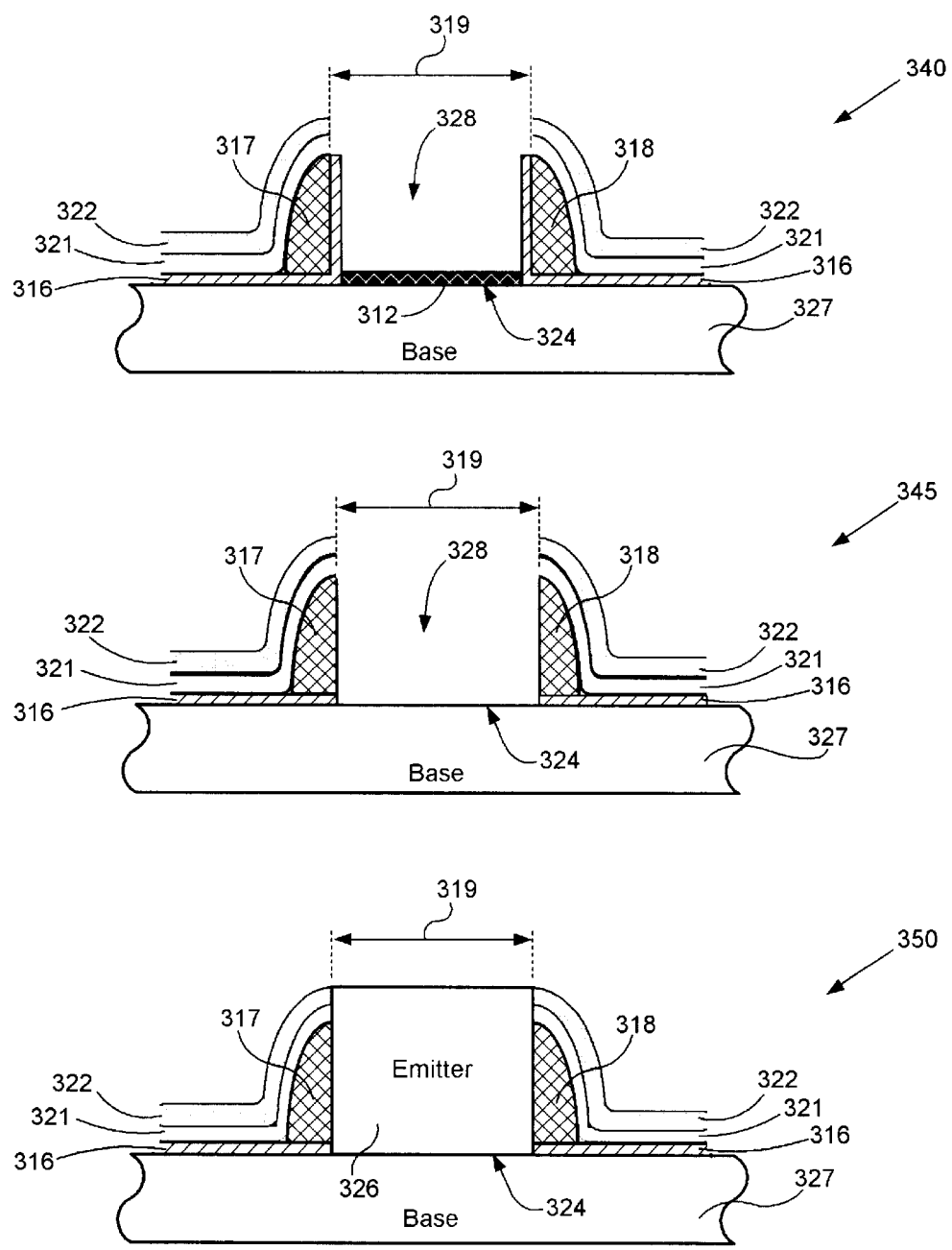
FIG. 3C illustrates cross-sectional views, which include portions of a silicon wafer processed according to an embodiment of the invention, corresponding to certain steps of FIG. 2.

Referring to FIGS. 3A, 3B, and 3C, each of structures 310, 315, 320, 325, 330, 335, 340, 345, and 350 of FIGS. 3A, 3B, and 3C illustrates the result of performing, on structure 300, steps 210, 215, 220, 225, 230, 235, 240, 245, and 250 of flowchart 200 of FIG. 2, respectively. For example, structure 310 shows structure 300 after processing step 210, structure 315 shows structure 310 after the processing of step 215, and so forth.

Continuing with step 210 in FIG. 2 and structure 310 in FIG. 3A, step 210 of flowchart 200 comprises the formation of a self-aligned sacrificial polysilicon post, i.e. polysilicon post 314, over a silicon dioxide (or "silicon oxide") layer, i.e. base oxide layer 312, on top surface 324 of structure 300. It is noted that silicon oxide is also referred to as "oxide" in the present application. Base oxide layer 312 may be formed by patterning and etching a layer of silicon oxide, which may be deposited in a low pressure chemical vapor deposition ("LPCVD") process at a temperature of approximately 650–700° C., for example. In one embodiment, base oxide layer 312 has a thickness of approximately 100.0 Angstroms, and acts as an etch stop layer that provides control for a subsequent etch step. Polysilicon post 314 may be formed by patterning and etching a layer of polysilicon, which may be deposited over base oxide layer 312 by chemical vapor deposition ("CVD"), as known in the art. The result of step 210 of flowchart 200 is illustrated by structure 310 in FIG. 3A.

Referring to step 215 in FIG. 2 and structure 315 in FIG. 3A, at step 215 of flowchart 200, etch stop layer 316 is deposited over polysilicon post 314. Etch stop layer 316 acts as an etch stop for a subsequent nitride etch, and may comprise silicon dioxide. The thickness of etch stop layer 316 may be such that it is less than or equal to the thickness of base oxide layer 312. For example, the thickness of etch stop layer 316 may be approximately 50.0 to 100.0 Angstroms. In the present embodiment, etch stop layer 316 can be deposited in a LPCVD process. Referring to FIG. 3A, the result of step 215 of flowchart 200 is illustrated by structure 315.

Continuing with step 220 in FIG. 2 and structure 320 in FIG. 3A, step 220 of flowchart 200 comprises depositing a conformal layer of silicon nitride on etch stop layer 316. The deposited conformal layer of silicon nitride can then be etched back to form nitride spacers 317 and 318. For example, nitride spacers 317 and 318 can be formed by anisotropically etching the conformal layer of silicon nitride using, for example, a chlorine based etchant. The above anisotropic nitride etch is selective to silicon oxide etch stop layer 316. In other words, the anisotropic nitride etch will not erode etch stop layer 316. The distance between nitride spacers 317 and 318 is substantially equal to critical dimension 319 in structure 320 in FIG. 3A. In the present embodiment, nitride spacers 317 and 318 are formed from a layer of silicon nitride that is deposited in a LPCVD process or, alternatively, in a reduced temperature chemical vapor deposition ("RTCVD") process.

By way of background, the deposition of LPCVD silicon nitride may be done at a temperature of approximately 650.0° C. while the RTCVD deposition may be done at, approximately 750.0°C. At these relatively high processing temperatures, the boron in the SiGe base diffuses, creating a base dimension that is wider than desired. In the present embodiment, carbon is added to the SiGe base in order to preserve the boron profile in the SiGe base during the higher temperature LPCVD or RTCVD processes. The composition of base 327 may be approximately 92.0% silicon, 7.5% germanium, and 0.5% carbon, for example. In one embodiment of the present invention, a diffusion suppressant other than carbon may be added to the SiGe base.

As known in the art, LPCVD and RTCVD silicon nitride, or "thermal silicon nitride," has higher material density and higher etch-resistance relative to other silicon nitrides, e.g. plasma-enhanced chemical vapor deposition ("PECVD") silicon nitride. LPCVD and RTCVD silicon nitride are not etched in a hydrogen fluoride ("HF") wet etch process, for example, whereas PECVD silicon nitride is more porous and may be etched by HF. Moreover, the LPCVD and RTCVD processes typically provide a more conformal film deposition. Referring to FIG. 3A, the result of step 220 of flowchart 200 is illustrated in FIG. 3A as structure 320.

Continuing with step 225 in FIG. 2 and structure 325 in FIG. 3B, at step 225, amorphous layer 321 is deposited over nitride spacers 317 and 318 and etch stop layer. 316. Amorphous layer 321 may comprise amorphous silicon. In other embodiments, amorphous layer 321 may be replaced by a layer composed of polycrystalline silicon, amorphous SiGe, or amorphous silicon carbide. Referring to FIG. 3B, the result of step 225 of flowchart 200 is illustrated in FIG. 3B as structure 325.

Referring to step 230 in FIG. 2 and structure 330 in FIG. 3B, step 230 comprises depositing ARC layer 322 over amorphous layer 321. For example, ARC layer 322 may comprise silicon oxynitride. The addition of ARC layer 322 provides a number of functions, such as the reduction of "subsurface reflection," which degrades image definition of the photoresist by exposing portions of photoresist not intended to be exposed. Degradation of image definition is a factor in loss of control over critical dimension. Other types of antireflective coating could also be used, for example, any of several types of spun-on polymer bottom antireflective coating or "BARC" as known in the art. Referring to FIG. 3B, the result of step 230 of flowchart 200 is illustrated in structure 330.

Continuing with step 235 in FIG. 2 and structure 335 in FIG. 3B, at step 235, ARC layer 322 and amorphous layer 321 are selectively etched to expose etch stop layer 316. By utilizing a selective etch process as known in the art, only ARC layer 235 and amorphous layer 321 are etched. The selective etch process is selective to silicon oxide, and thus etch stop layer 316 is not etched. Referring to FIG. 3B, the result of step 235 of flowchart 200 is illustrated in FIG. 3B as structure 335. At step 240, etch stop layer 316 and polysilicon post 3 14 are removed in a selective etching process to form emitter window opening 328 shown in structure 340 in FIG. 3C. The result of step 240 of flowchart 200 is illustrated in FIG. 3C as structure 340.

Continuing with step 245 in FIG. 2 and structure 345 in FIG. 3C, step 245 comprises the selective etching of base oxide layer 312 and etch stop layer 316 on side walls of emitter window opening. In step 245, etching occurs in a downward direction into base oxide layer 312 and laterally into etch stop layer 316 on side walls of emitter window opening 328. Base oxide layer 312 and etch stop layer 316 may be etched, for example, by an HF wet etch. As discussed above, nitride spacers 317 and 318 are composed of LPCVD or RTCVD silicon nitride. Thus, nitride spacers 317 and 318 are not etched in step 245 since the HF wet etch is selective to LPCVD and RTCVD silicon nitride. As a result, the distance between nitride spacers 317 and 318, i.e. critical dimension 319, remains substantially unchanged. Thus, by providing nitride spacers 317 and 318, the present invention achieves accurate control of critical dimension 319. Referring to FIG. 3C, the result of step 245 of flowchart 200 is illustrated in FIG. 3C as structure 345.

Referring to step 250 in FIG. 2 and structure 350 in FIG. 3C, at step 250, N-type polycrystalline silicon is deposited onto top surface 324 of base 327 between nitride spacers 317 and 318 to form emitter 326. Emitter 326 has a width substantially equal to critical dimension 319. Thus, in the present invention, critical dimension 319 remains substantially unchanged throughout the processing steps of flowchart 200. In other words critical dimension 319 is preserved as initially printed after photolithography. Thus, the present invention achieves an emitter, i.e. emitter 326, having a width that is precisely defined, and substantially equal to, critical dimension 319. Referring to FIG. 3C, the result of step 250 of flowchart 200 is illustrated in FIG. 3C as structure 350.

Thus, emitter 326 can be advantageously formed with emitter width substantially as small as the resolution of photolithography techniques will allow because the present invention achieves control of critical dimension 319 by providing nitride spacers 317 and 318, which suffer substantially no lateral etching during formation of emitter 326. Thus, the present invention allows formation of an HBT with feature size substantially as small as photolithography is capable of producing.

It is appreciated by the above detailed disclosure that the invention provides method for controlling critical dimension in an HBT emitter and related structure. Although the invention is described as applied to the fabrication of a heterojunction bipolar transistor, it will be readily apparent to a person of ordinary skill in the art how to apply the invention in a similar situation where a smaller, more accurately controlled emitter structure is required.

From the description of the above invention it is evident that various techniques can be used for implementing the concepts of the present invention without departing from its scope and spirit. Moreover, while the invention has been described with specific reference to certain embodiments, a person of ordinary skills in the art would recognize that changes made in form and detail without departing from the spirit and scope of the invention. For example, as stated above, amorphous layer 321 can be replaced with alternative layers comprised of polycrystalline silicon, amorphous SiGe, amorphous silicon carbide, or polycrystalline silicon carbide, without departing from the scope of the present invention. Moreover, although ARC layer 322 is utilized in an embodiment of the present invention, as described above, other embodiments of the invention may be practiced without utilizing an ARC layer.

The described embodiments are to be considered in all respects as illustrative and not restrictive. For example, although in the specific embodiment of the invention described above, emitter 326 was described as a polycrystalline emitter, it is possible to use an amorphous silicon emitter which is re-crystallized to form a polycrystalline silicon emitter. Moreover, the invention's teachings regarding controlling critical dimension can also be applied to control critical dimensions in contexts other than controlling emitter width as specifically described in the present application. For example, the invention's teachings can be applied to achieve critical dimensions for small features such as contact openings in various semiconductor devices. Therefore, it should be understood that the invention is not limited to the particular embodiments described herein, but is capable of many rearrangements, modifications, and substitutions without departing from the scope of the invention.

Thus, method for controlling critical dimension in an HBT emitter and related structure have been described.

What is claimed is:

1. A heterojunction bipolar transistor comprising:

a base having a top surface;

a first nitride spacer and a second nitride spacer situated on said top surface of said base, said first nitride spacer and said second nitride spacer being separated by a distance substantially equal to a critical dimension, said first nitride spacer and said second nitride spacer defining an emitter window opening;

an emitter situated between said first nitride spacer and said second nitride spacer in said emitter window opening, said emitter having an emitter width substantially equal to said critical dimension.

2. The heterojunction bipolar transistor of claim 1 further comprising an etch stop layer situated on said top surface of said base, said first and second nitride spacers being situated on said etch stop layer.

3. The heterojunction bipolar transistor of claim 2 wherein said etch stop layer comprises silicon oxide.

4. The heterojunction bipolar transistor of claim 1 wherein said emitter comprises a polycrystalline material.

5. The heterojunction bipolar transistor of claim 4 wherein said polycrystalline material comprises polycrystalline silicon.

6. The heterojunction bipolar transistor of claim 1 further comprising an amorphous layer situated on said first nitride spacer and said second nitride spacer.

7. The heterojunction bipolar transistor of claim 6 further comprising an antireflective coating layer situated on said amorphous layer.

8. The heterojunction bipolar transistor of claim 7 wherein said antireflective coating layer comprises silicon oxynitride.

9. The heterojunction bipolar transistor of claim 6 wherein said amorphous layer comprises amorphous silicon.

10. The heterojunction bipolar transistor of claim 1 wherein said first nitride spacer and said second nitride spacer comprise LPCVD silicon nitride.

11. The heterojunction bipolar transistor of claim 1 wherein said first nitride spacer and said second nitride spacer comprise RTCVD silicon nitride.

12. The heterojunction bipolar transistor of claim 1 wherein said heterojunction bipolar transistor is an NPN silicon-germanium heterojunction bipolar transistor.

13. A heterojunction bipolar transistor comprising:

a base having a top surface;

a first nitride spacer and a second nitride spacer situated on said top surface of said base, said first nitride spacer and said second nitride spacer being separated by a distance substantially equal to a critical dimension;

an emitter situated between said first nitride spacer and said second nitride spacer, said emitter having an emitter width substantially equal to said critical dimension;

an amorphous layer situated on said first nitride spacer and said second nitride spacer.

14. The heterojunction bipolar transistor of claim 13 further comprising an antireflective coating layer situated on said amorphous layer.

15. The heterojunction bipolar transistor of claim 14 wherein said antireflective coating layer comprises silicon oxynitride.

16. The heterojunction bipolar transistor of claim 13 wherein said amorphous layer comprises amorphous silicon.

* * * * *